(12) United States Patent
Chen et al.

(10) Patent No.: US 10,524,348 B1
(45) Date of Patent: Dec. 31, 2019

(54) LIQUID COOLING DEVICE

(71) Applicant: Cooler Master Co., Ltd., New Taipei (TW)

(72) Inventors: Hsin-Hung Chen, New Taipei (TW); Chien-Liang Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 16/197,621

(22) Filed: Nov. 21, 2018

(30) Foreign Application Priority Data

Jun. 13, 2018 (TW) .............................. 107120264 A

(51) Int. Cl.
*H05K 1/02* (2006.01)
*H05K 7/20* (2006.01)

(52) U.S. Cl.
CPC ....... *H05K 1/0203* (2013.01); *H05K 7/20254* (2013.01); *H05K 7/20272* (2013.01); *H05K 2201/064* (2013.01); *H05K 2201/10409* (2013.01)

(58) Field of Classification Search
CPC .......................... H05K 7/20254; H05K 1/0203
See application file for complete search history.

(56) References Cited

U.S. PATENT DOCUMENTS

| | | | | |
|---|---|---|---|---|
| 6,288,371 B1* | 9/2001 | Hamilton | ........... | G01R 31/2849 165/185 |
| 7,714,423 B2* | 5/2010 | Reid | ...................... | H05K 1/021 257/686 |
| 8,891,240 B2* | 11/2014 | Chua | ...................... | H01L 23/473 361/689 |
| 9,474,146 B2* | 10/2016 | Hori | .................... | H01L 23/3735 |
| 9,717,161 B2* | 7/2017 | Katsumata | ......... | H05K 7/20254 |
| 2015/0136372 A1* | 5/2015 | Sherbeck | ............ | H01L 23/3677 165/170 |
| 2015/0369544 A1* | 12/2015 | Franz | ................. | H05K 7/20254 165/185 |
| 2019/0045662 A1* | 2/2019 | Schroeder | .......... | H05K 7/20436 |
| 2019/0281730 A1* | 9/2019 | Gao | ................... | H05K 7/20772 |

* cited by examiner

*Primary Examiner* — Hung V Ngo
(74) *Attorney, Agent, or Firm* — Locke Lord LLP; Tim Tingkang Xia, Esq.

(57) ABSTRACT

A liquid cooling device, which is configured to be in thermal contact with a first and a second heat sources which are disposed on a PCB, includes a first and a second thermal plates and a first and a second thermal blocks. The first thermal plate is configured to be disposed on the PCB. The second thermal plate is disposed on the first thermal plate. The thermal plates together form a storage space configured to store a coolant. The thermal blocks are configured to respectively be in thermal contact with the heat sources. The thermal blocks are movably disposed on the second thermal plate, such that protruding heights of the thermal blocks from the second thermal plate are adjustable respectively according to a gap width between the first heat source and the second thermal plate and a gap width between the second heat source and the second thermal plate.

47 Claims, 12 Drawing Sheets

US 10,524,348 B1

LIQUID COOLING DEVICE

CROSS-REFERENCE TO RELATED APPLICATIONS

This non-provisional application claims priority under 35 U.S.C. § 119(a) on Patent Application No(s). 107120264 filed in Taiwan on Jun. 13, 2018, the entire contents of which are hereby incorporated by reference.

TECHNICAL FIELD

The disclosure relates to a liquid cooling device, more particularly to a liquid cooling device having a movable thermal block.

BACKGROUND

In a computer system, a central processing unit, a north bridge chip, a south bridge chip and a graphics processing unit on a motherboard all are integrated circuit chips. The integrated circuit chips are the main heat source in the computer system. In order to quickly remove heat generated by these integrated circuit chips, a liquid cooling system utilizes a cold plate to directly contact back surfaces of these integrated circuit chips, and utilizes coolant flowing through the cold plate to take unwanted heat to a radiator through a liquid circulation.

The arrangement of the cold plate and the heat source may be one-to-one or one-to-many. In the former case, the pressure of the cold plate pressing on the heat source is the only factor that needs to be taken into consideration for ensuring thermal contact between the cold plate and the heat source. However, in the latter case, it is unlikely for a single cold plate to be in tight contact with multiple heat sources because there are assembling tolerances among each heat source and thus the heat dissipation capacity of the cold plate is not effectively exerted.

SUMMARY

The present disclosure provides a liquid cooling device which solves the problem of a single cold plate unable to be in tight contact with multiple heat sources due to assembling tolerances among different heat sources existing in the conventional liquid cooling system.

One embodiment of the disclosure provides a liquid cooling device configured to be in thermal contact with a first heat source and a second heat source which are disposed on a printed circuit board. The liquid cooling device includes a first thermal plate, a second thermal plate, a first thermal block and a second thermal block. The first thermal plate is configured to be disposed on the printed circuit board. The second thermal plate is disposed on the first thermal plate. The first thermal plate and the second thermal plate together form a storage space, and the storage space is configured to store a coolant. The first thermal block is configured to be in thermal contact with the first heat source, and the second thermal block is configured to be in thermal contact with the second heat source. The first thermal block and the second thermal block are movably disposed on the second thermal plate, such that a protruding height of the first thermal block from the second thermal plate is adjustable according to a gap width between the first heat source and the second thermal plate, and a protruding height of the second thermal block from the second thermal plate is adjustable according to a gap width between the second heat source and the second thermal plate.

One embodiment of the disclosure provides a liquid cooling device configured to be in thermal contact with a first heat source and a second heat source which are disposed on a printed circuit board. The liquid cooling device includes a first thermal plate, a second thermal plate, a first thermal block and a second thermal block. The first thermal plate is configured to be disposed on the printed circuit board. The second thermal plate is disposed on the first thermal plate. The first thermal plate and the second thermal plate together form a storage space, and the storage space is configured to store a coolant. The first thermal block is configured to be in thermal contact with the first heat source, and the second thermal block is configured to be in thermal contact with the second heat source. The second thermal block is immovably fixed on the second thermal plate. The first thermal block is movably disposed on the second thermal plate, such that a protruding height of the first thermal block from the second thermal plate is adjustable according to a gap width between the first heat source and the second thermal plate.

One embodiment of the disclosure provides a liquid cooling device configured to be in thermal contact with a first heat source which is disposed on a printed circuit board. The liquid cooling device includes a first thermal plate, a second thermal plate, a first thermal block and a first elastic component. The first thermal plate is configured to be disposed on the printed circuit board. The second thermal plate is disposed on the first thermal plate. The first thermal plate and the second thermal plate together form a storage space, and the storage space is configured to store a coolant. The first thermal block is configured to be in thermal contact with the first heat source, and the first thermal block is movably disposed on the second thermal plate. The first elastic component surrounds the first thermal block. One end of the first elastic component is connected to the second thermal plate, and another end of the first elastic component is connected to the first thermal block so that the first elastic component forces the first thermal block to move away from the first thermal plate, and a protruding height of the first thermal block from the second thermal plate is adjustable according to a gap width between the first heat source and the second thermal plate.

One embodiment of the disclosure provides a liquid cooling device configured to be in thermal contact with a first heat source which is disposed on a printed circuit board. The liquid cooling device includes a first thermal plate, a second thermal plate, a first thermal block, a plurality of first guiding pillars and a plurality of first elastic components. The first thermal plate is configured to be disposed on the printed circuit board. The second thermal plate is disposed on the first thermal plate. The first thermal plate and the second thermal plate together form a storage space, and the storage space is configured to store a coolant. The first thermal block is configured to be in thermal contact with the first heat source, and the first thermal block is movably disposed on the second thermal plate. One end of each of the first guiding pillars is fixed on the second thermal plate, another end of each of the first guiding pillars is integrated into the first thermal block. The first elastic components respectively surround the first guiding pillars. One end of each of the first elastic components is connected to the second thermal plate, and another end of each of the first elastic components is connected to the first thermal block so that the first elastic components force the first thermal block to move away from the first thermal plate, and a protruding height of the first thermal block from the second thermal plate is adjustable according to a gap width between the first heat source and the second thermal plate.

One embodiment of the disclosure provides a liquid cooling device configured to be in thermal contact with a first heat source which is disposed on a printed circuit board. The liquid cooling device includes a first thermal plate, a second thermal plate, a first thermal block and a plurality of first guiding pillars. The first thermal plate is configured to be disposed on the printed circuit board. The second thermal plate is disposed on the first thermal plate. The first thermal plate and the second thermal plate together form a storage space and the storage space is configured to store a coolant. The first thermal block is configured to be in thermal contact with the first heat source, and the first thermal block is movably disposed on the second thermal plate. One end of each of the first guiding pillars is fixed on the second thermal plate, another end of each of the first guiding pillars is integrated into the first thermal block so as to guide the first thermal block to move relative to the second thermal plate. The fasteners are respectively disposed through the first thermal plate, the second thermal plate and the plurality of first guiding pillars and configured to be fixed to the printed circuit board.

According to the liquid cooling device as described above, in some embodiments, there are a plurality of thermal blocks disposed on the second thermal plate to be in thermal contact with the heat sources, and at least one of the thermal blocks is movably disposed on the second thermal plate, such that the protruding height of the movable thermal block from the second thermal plate is adjustable according to the gap width between the heat source and the second thermal plate. As such, regardless of the mechanical interference between the heat source and the thermal block or the gap between the heat source and the thermal block, the thermal blocks are ensured to be in thermal contact with the heat sources.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
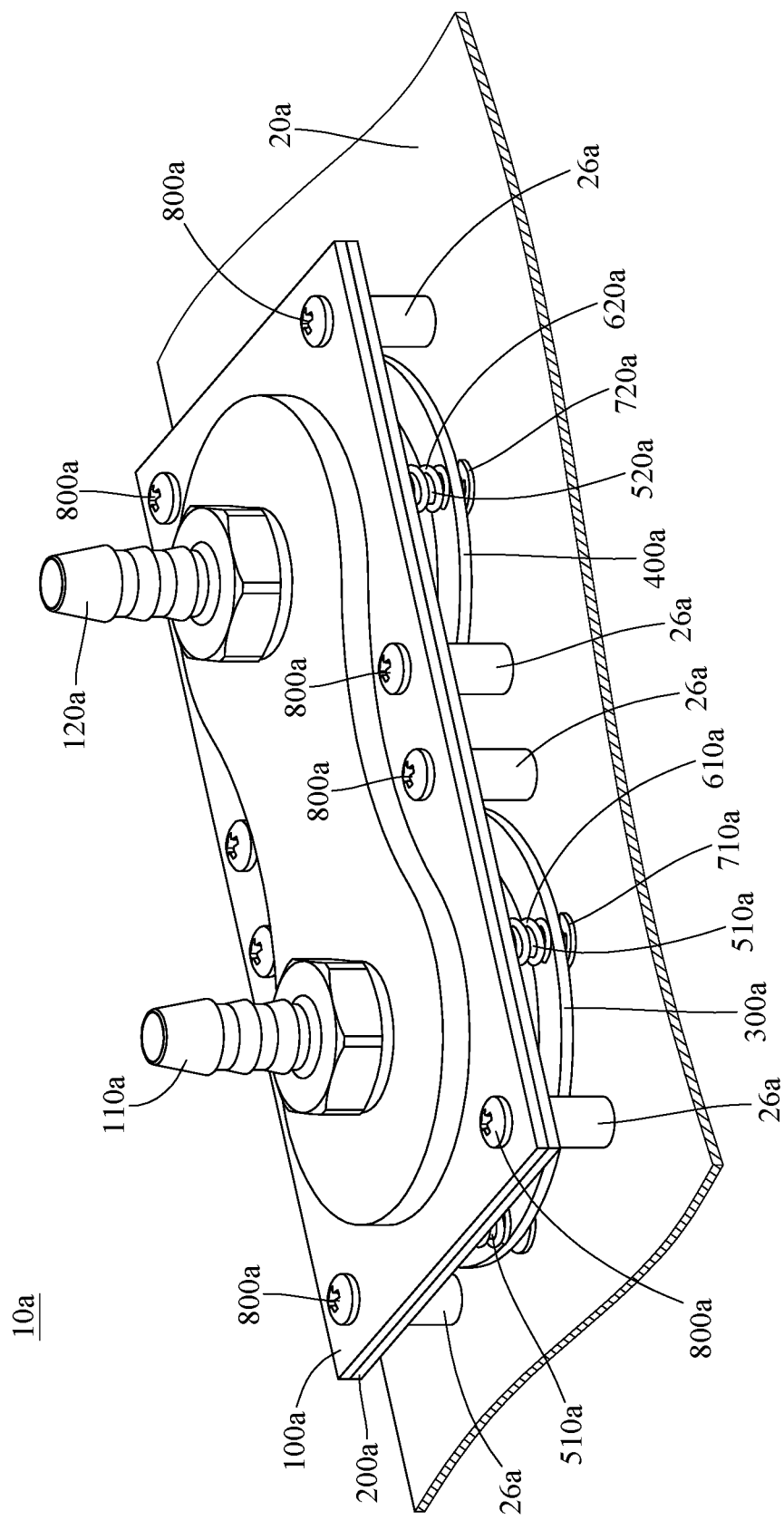
FIG. 1 is a perspective view of a liquid cooling device disposed on a printed circuit board in accordance with a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known accommodation structures and devices are schematically shown in order to simplify the drawing.

Figure 2:
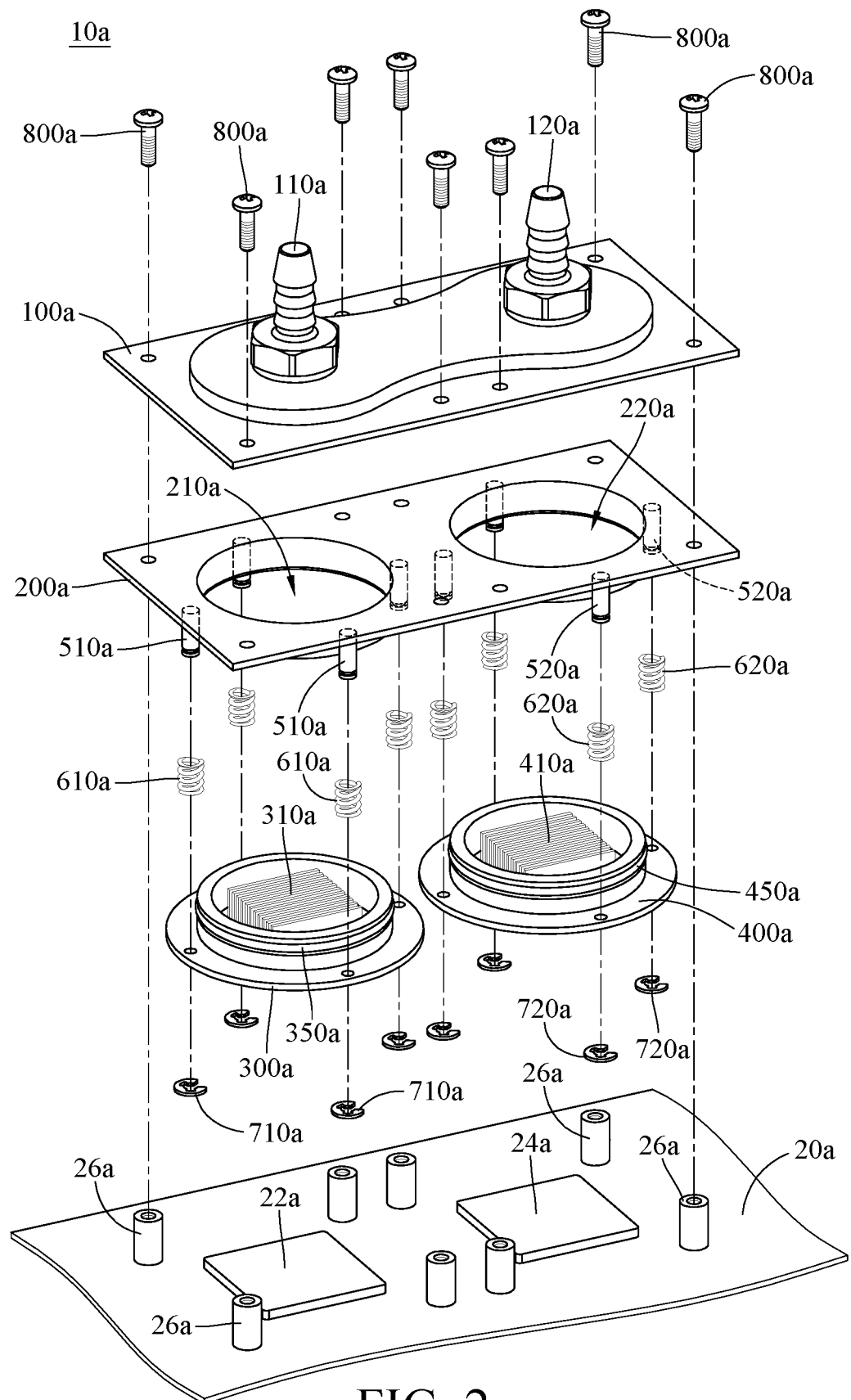
FIG. 2 is an exploded view of FIG. 1.
Figure 3:
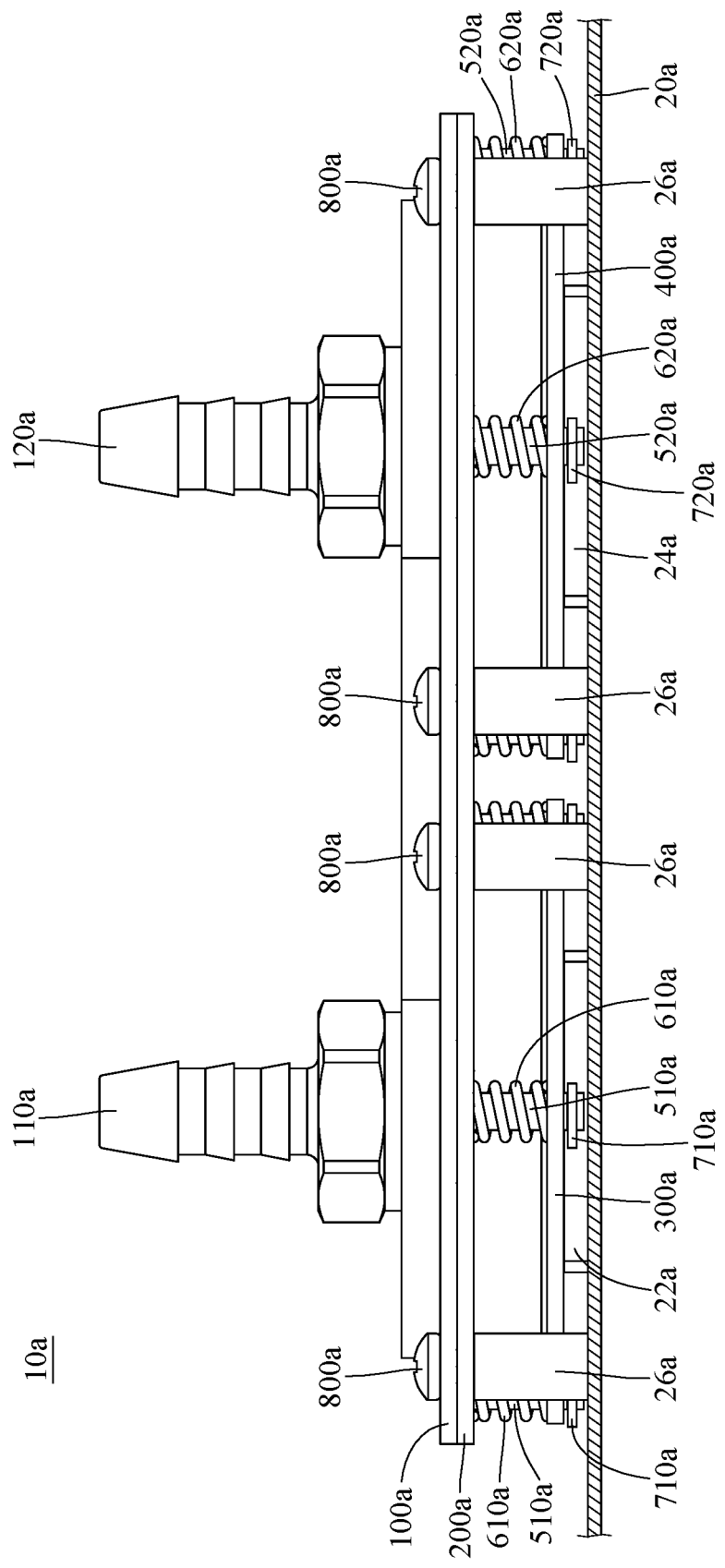
FIG. 3 is a side view of FIG. 1.
Figure 4:
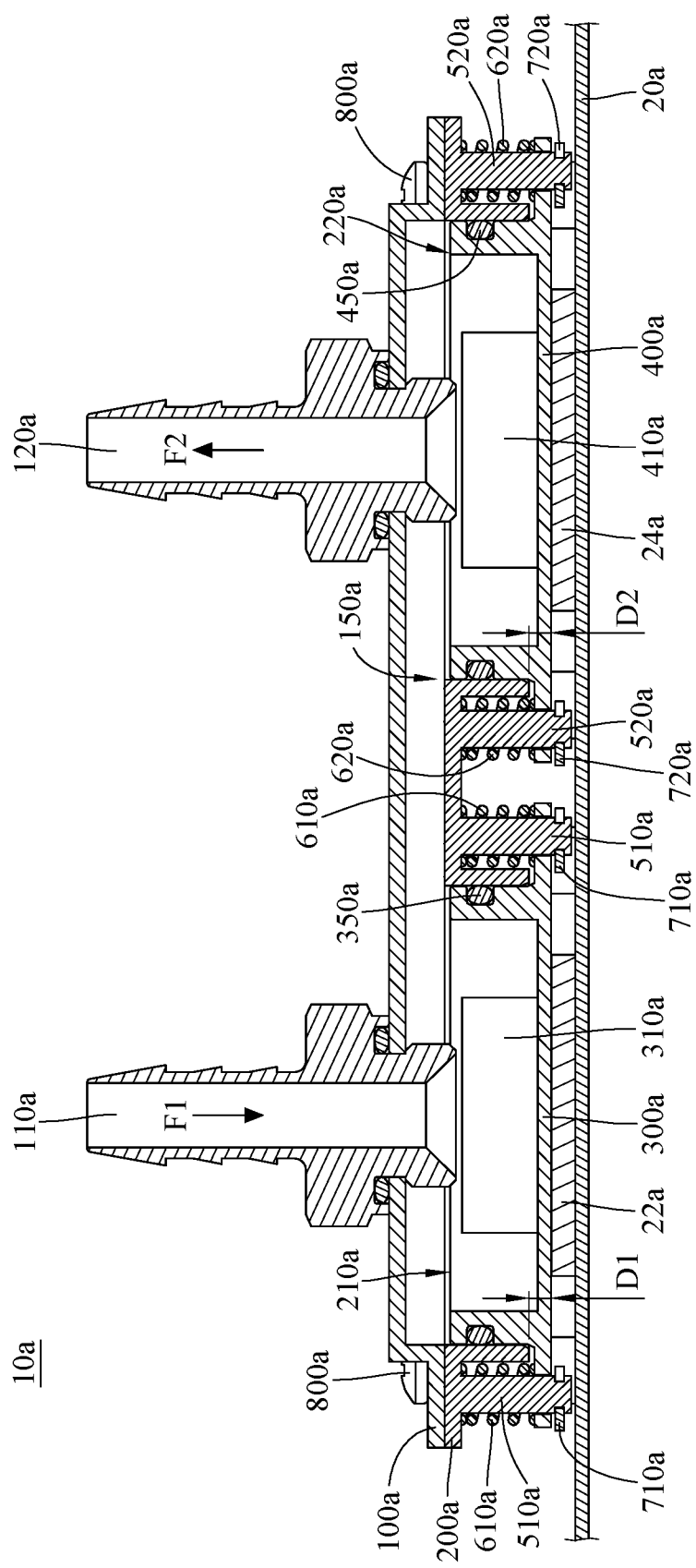
FIG. 4 is a cross-sectional view of FIG. 1.

Please refer to FIG. 1 to FIG. 4. FIG. 1 is a perspective view of a liquid cooling device disposed on a printed circuit board in accordance with a first embodiment of the present disclosure, FIG. 2 is an exploded view of FIG. 1, FIG. 3 is a side view of FIG. 1, and FIG. 4 is a cross-sectional view of FIG. 1.

In this embodiment, a liquid cooling device 10a is provided. The liquid cooling device 10a is, for example, a water cooling plate applied to an electronic control unit in order to cool a heat source in the electronic control unit. In detail, the electronic control unit includes, for example, a printed circuit board 20a, a first heat source 22a and a second heat source 24a. The first heat source 22a and the second heat source 24a are disposed on the printed circuit board 20a. The liquid cooling device 10a is configured to be in thermal contact with the first heat source 22a and the second heat source 24a, such that coolant flowing through the liquid cooling device 10a is able to cool the first heat source 22a and the second heat source 24a. The first heat source 22a and the second heat source 24a are, for example, central processing units or graphics processing units.

The liquid cooling device 10a includes a first thermal plate 100a, a second thermal plate 200a, a first thermal block 300a and a second thermal block 400a.

The second thermal plate 200a is disposed on the first thermal plate 100a, and the first thermal plate 100a and the second thermal plate 200a together form a storage space 150a. The storage space 150a is configured to store coolant (not shown in figures). The coolant is, for example, water or refrigerant. Furthermore, the first thermal plate 100a has a liquid inlet 110a and a liquid outlet 120a which are connected to the storage space 150a, allowing coolant to flow into the storage space 150a via the liquid inlet 110a (as shown by arrow F1) and flow out of the storage space 150a via the liquid outlet 120a (as shown by arrow F2).

The first thermal block 300a has a plurality of first cooling fins 310a which are located in the storage space 150a and able to increase the heat exchange rate between the coolant and the first thermal block 300a in the storage space 150a. Similarly, the second thermal block 400a has a plurality of second cooling fins 410a which are located in the storage space 150a and able to increase the heat exchange rate between the coolant and the second thermal block 400a in the storage space 150a.

The first thermal block 300a is configured to be in thermal contact with the first heat source 22a, and the second thermal block 400a is configured to be in thermal contact with the second heat source 24a. Both the first thermal block 300a and the second thermal block 400a are movably disposed on the second thermal plate 200a, such that a protruding height of the first thermal block 300a from the second thermal plate 200a is adjustable according to a gap width between the first heat source 22a and the second thermal plate 200a, and a protruding height of the second thermal block 400a from the second thermal plate 200a is adjustable according to a gap width between the second heat source 24a and the second thermal plate 200a.

In detail, the second thermal plate 200a further has a first through hole 210a and a second through hole 220a. The first through hole 210a and the second through hole 220a are connected to the storage space 150a, the first thermal block 300a is slidably disposed in the first through hole 210a, and the second thermal block 400a is slidably disposed in the second through hole 220a.

The liquid cooling device 10a further includes a first sealing component 350a, a second sealing component 450a, a plurality of first guiding pillars 510a, a plurality of second guiding pillars 520a, a plurality of first retaining rings 710a, a plurality of second retaining rings 720a, a plurality of first elastic components 610a and a plurality of second elastic components 620a.

The first sealing component 350a is located between and clamped by the second thermal plate 200a and the first thermal block 300a, and the second sealing component 450a is located between and clamped by the second thermal plate 200a and the second thermal block 400a, such that the coolant in the storage space 150a is prevented from leaking through a gap between the second thermal plate 200a and the first thermal block 300a or a gap between the second thermal plate 200a and the second thermal block 400a to the exterior.

One end of each of the first guiding pillars 510a is fixed on the second thermal plate 200a by welding or riveting. Another end of each of the first guiding pillars 510a is integrated into the first thermal block 300a. Specifically, the another end of each of the first guiding pillars 510a is disposed through the first thermal block 300a, and the first retaining rings 710a are respectively attached to the first guiding pillars 510a and located on one side of the first thermal block 300a away from the first thermal plate 100a for restricting movement of the first thermal block 300a, and thereby the another end of each of the first guiding pillars 510a is integrated into the first thermal block 300a. In addition, the second thermal plate 200a and each of the first retaining rings 710a respectively function as movement limitation means for a top dead center and a bottom dead center of the first thermal block 300a. In this embodiment, a distance between the top dead center and the bottom dead center is, but not limited to, 0.8 mm. In other embodiments, a distance between the top dead center and the bottom dead center may be determined by assembling tolerances of each heat source.

Similarly, one end of each of the second guiding pillars 520a is fixed on the second thermal plate 200a by welding or riveting. Another end of each of the second guiding pillars 520a is disposed through the second thermal block 400a. Specifically, the another end of each of second guiding pillars 520a is disposed through the second thermal block 400a, and the second retaining rings 720a are respectively attached to the second guiding pillars 520a and located on one side of the second thermal block 400a away from the first thermal plate 100a for restricting movement of the second thermal block 400a, and thereby the another end of each of the second guiding pillars 520a is disposed through the second thermal block 400a. In addition, the second thermal plate 200a and each of the second retaining rings 720a respectively function as movement limitation means for a top dead center and a bottom dead center of the second thermal block 400a.

The first elastic components 610a are, for example, compression springs, and are respectively sleeved on the first guiding pillars 510a. One end of each of the first elastic components 610a presses against the second thermal plate 200a, and another end of each of the first elastic components 610a presses against the first thermal block 300a so that the first elastic components 610a force the first thermal block 300a to move away from the first thermal plate 100a. That is, when the first thermal block 300a is not in contact with the heat source, the first thermal block 300a is constantly located at the bottom dead center thereof and presses against the first retaining rings 710a by experiencing an elastic force applied by the first elastic components 610a.

Similarly, the second elastic components 620a are, for example, compression springs, and are respectively sleeved on the second guiding pillars 520a. One end of each of the second elastic components 620a presses against the second thermal plate 200a, and another end of each of the second elastic components 620a presses against the second thermal block 400a so that the second elastic components 620a force the second thermal block 400a to move away from the first thermal plate 100a. That is, when the second thermal block 400a is not in contact with the heat source, the second thermal block 400a is constantly located at the bottom dead center thereof and presses against the second retaining rings 720a by experiencing an elastic force applied by the second elastic components 620a.

The fasteners 800a are, for example, screws, and are disposed through the first thermal plate 100a and the second thermal plate 200a. The fasteners 800a are configured to be fixed to assembling studs 26a of the printed circuit board 20a so as to fix the first thermal plate 100a above the printed circuit board 20a, and as such, the first thermal block 300a and the second thermal block 400a are suspended on the second thermal plate 200a. In other embodiments, the fasteners 800a may be directly fixed to the board body of the printed circuit board 20a without the assembling studs 26a connected therebetween, but the present disclosure is not limited thereto.

As shown in FIG. 4, when the first thermal block 300a and the second thermal block 400a of the liquid cooling device 10a respectively press against the first heat source 22a and the second heat source 24a, which are same in height, at the same time, a protruding height D1 of the first thermal block 300a from the second thermal plate 200a is equal to a protruding height D2 of the second thermal block 400a from the second thermal plate 200a due to a gap width between the first heat source 22a and the second thermal plate 200a being the same as a gap width between the second heat source 24a and the second thermal plate 200a.

Figure 5:
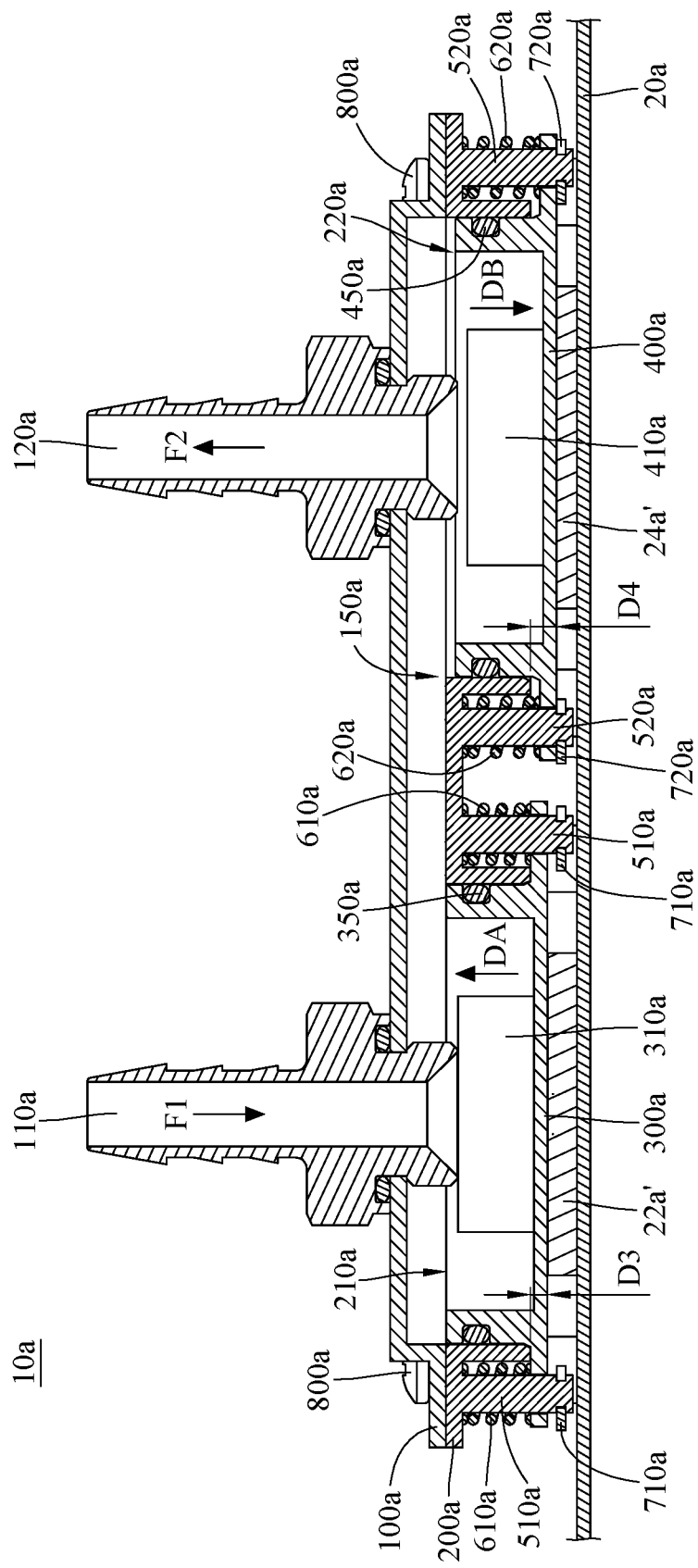
FIG. 5 is a cross-sectional view of the liquid cooling device in FIG. 1 when the liquid cooling device is in thermal contact with two heat sources which are different in height.

Then, please refer to FIG. 5, FIG. 5 is a cross-sectional view of the liquid cooling device in FIG. 1 when the liquid cooling device is in thermal contact with two heat sources which are different in height. As shown in the figure, a thickness of the first heat source 22a' is larger than that of the first heat source 22a shown in FIG. 1, and a thickness of the second heat source 24a' is smaller than that of the second heat source 24a shown in FIG. 1. In such a case, when the first thermal block 300a and the second thermal block 400a of the liquid cooling device 10a are respectively placed on the first heat source 22a' and the second heat source 24a', the first thermal block 300a is moved upwards along a direction DA by being pushed by the first heat source 22a', and the second thermal block 400a is moved downwards along a direction DB to press against the second heat source 24a' by the second elastic components 620a. In other words, due to the different thicknesses between the first heat source 22a' and the second heat source 24a', a protruding height D3 of the first thermal block 300a from the second thermal plate 200a is different from a protruding height D4 of the second thermal block 400a from the second thermal plate 200a. As such, a mechanical interference between the first thermal block 300a and the first heat source 22a' is prevented, and a gap between the second thermal block 400a and the second heat source 24a' is prevented, thereby ensuring the first thermal block 300a and the first heat source 22a' being in thermal contact with each other, and the second thermal block 400a and the second heat source 24a' being in thermal contact with each other.

The two heat sources designed with different thicknesses are described as an example in the above embodiment. However, in actual practice, there may be other causes that may result in two heat sources having their contact surfaces located at different heights, such as different assembling tolerances between the heat sources.

In the abovementioned embodiment, the first thermal block 300a and the second thermal block 400a are slidably disposed in the first through hole 210a and the second through hole 220a which are connected to the storage space 150a, but the present disclosure is not limited thereto. In other embodiments, the first thermal block 300a and the second thermal block 400a may be slidably disposed in a first through hole and a second through hole which are not connected to the storage space. In this case, there is no need to equip a water-proof component, such as a sealing component, between the second thermal plate 200a and the first thermal block 300a and the second thermal block 400a.

Furthermore, in the abovementioned embodiment, the second thermal plate 200a is integrated with the thermal blocks 300a and 400a by the guiding pillars 510a and 520a and the retaining rings 710a and 720a, but the present disclosure is not limited thereto. In other embodiments, the second thermal plate may be integrated with the thermal blocks by hooks.

Figure 6:
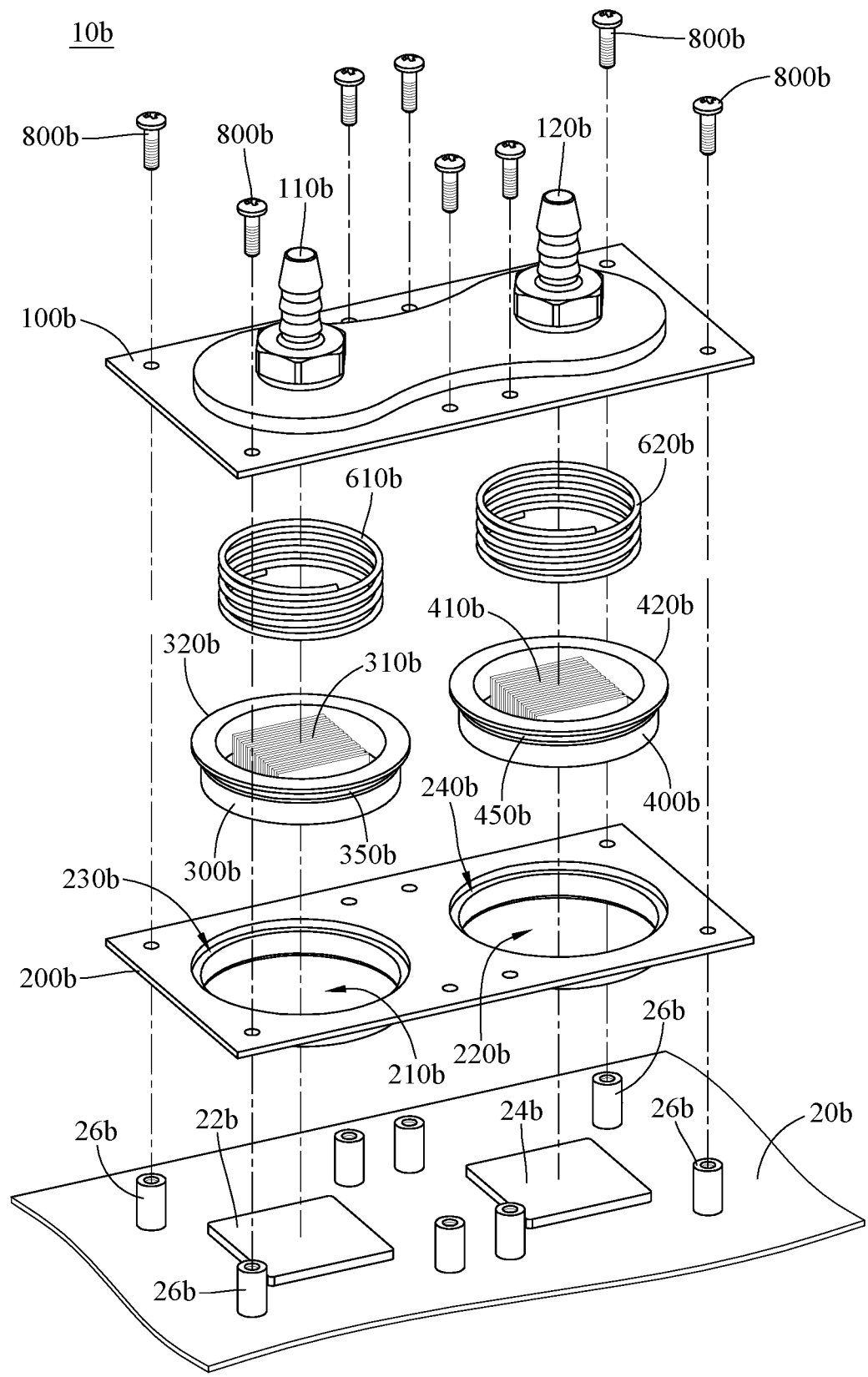
FIG. 6 is an exploded view of a liquid cooling device in accordance with a second embodiment of the present disclosure.
Figure 7:
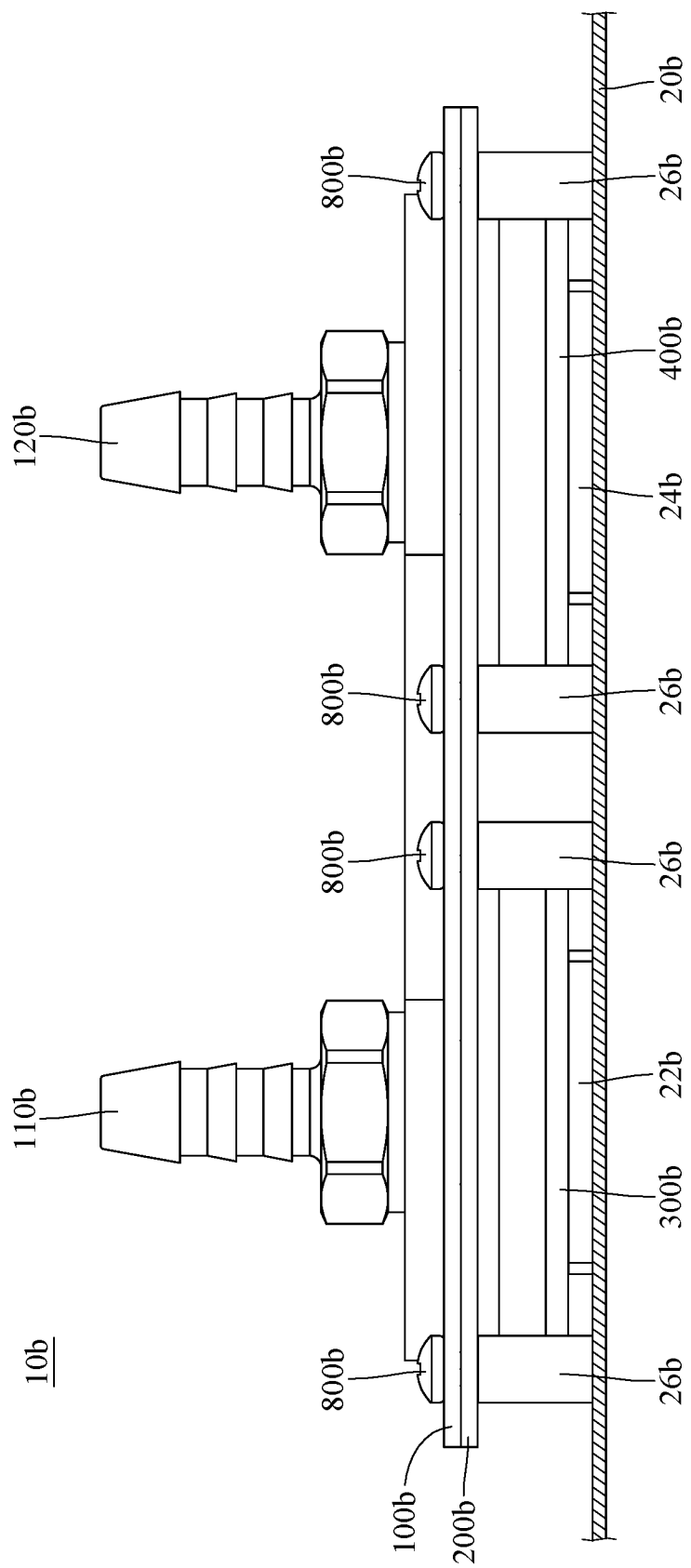
FIG. 7 is a side view of the liquid cooling device in accordance with the second embodiment of the present disclosure.
Figure 8:
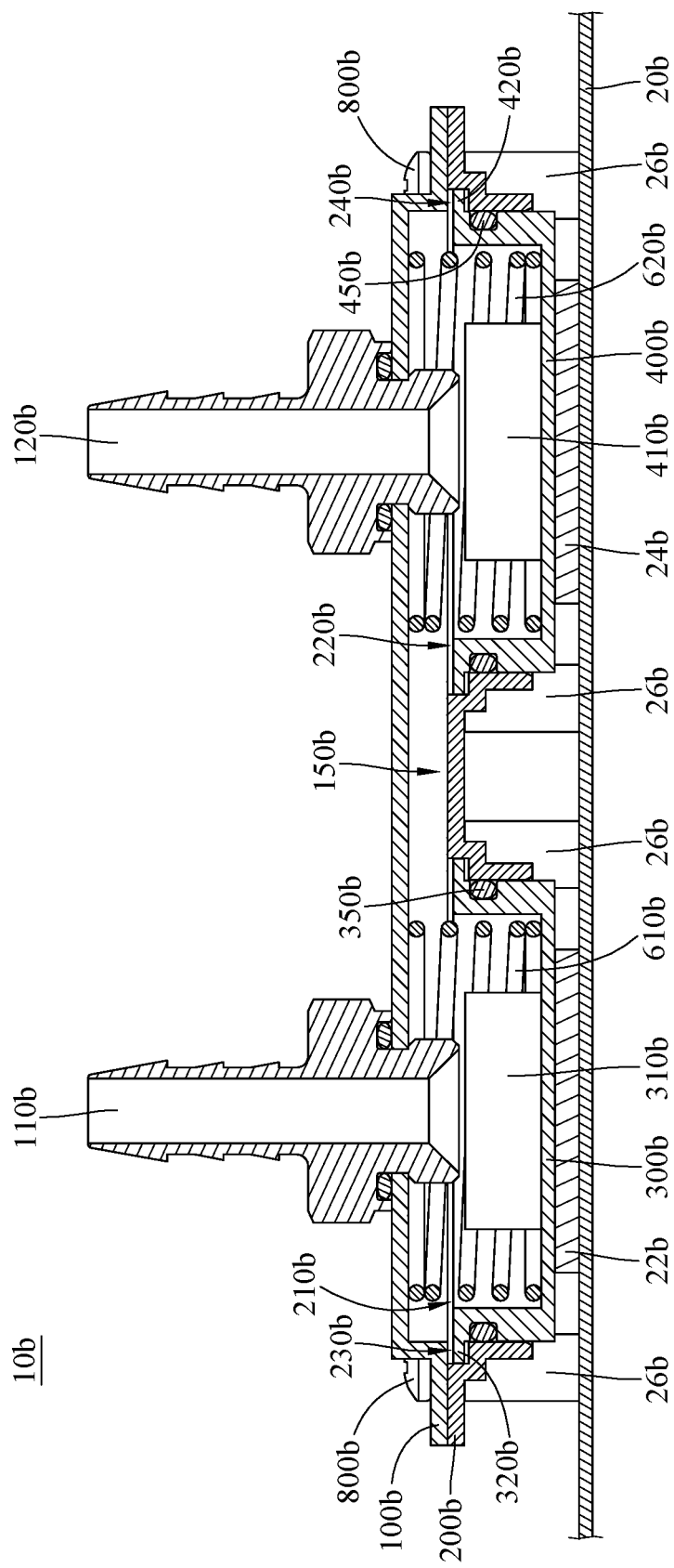
FIG. 8 is a cross-sectional view of FIG. 7.

In the abovementioned embodiment, the first elastic components 610a and the second elastic components 620a are located outside of the storage space 150a, but the present disclosure is not limited thereto. Please refer to FIG. 6 to FIG. 8. FIG. 6 is an exploded view of a liquid cooling device disposed on a printed circuit board in accordance with a second embodiment of the present disclosure, FIG. 7 is a side view of the liquid cooling device in accordance with the second embodiment of the present disclosure, and FIG. 8 is a cross-sectional view of FIG. 7.

In this embodiment, a liquid cooling device 10b is provided. The liquid cooling device 10b includes a first thermal plate 100b, a second thermal plate 200b, a first thermal block 300b and a second thermal block 400b.

The second thermal plate 200b is disposed on the first thermal plate 100b, and the first thermal plate 100b and the second thermal plate 200b together form a storage space 150b. The storage space 150b is configured to store coolant. The coolant is, for example, water or refrigerant.

The first thermal block 300b has a plurality of first cooling fins 310b which are located in the storage space 150b and able to increase the heat exchange rate between the coolant and the first thermal block 300b in the storage space 150b. Similarly, the second thermal block 400b has a plurality of second cooling fins 410b which are located in the storage space 150b and able to increase the heat exchange rate between the coolant and the second thermal block 400b in the storage space 150b.

The first thermal block 300b is configured to be in thermal contact with a first heat source 22b, and the second thermal block 400b is configured to be in thermal contact with a second heat source 24b. Both the first thermal block 300b and the second thermal block 400b are movably disposed on the second thermal plate 200b, such that a protruding height of the first thermal block 300b from the second thermal plate 200b is adjustable according to a gap width between the first heat source 22b and the second thermal plate 200b, and a protruding height of the second thermal block 400b from the second thermal plate 200b is adjustable according to a gap width between the second heat source 24b and the second thermal plate 200b.

In detail, the second thermal plate 200b further has a first through hole 210b and a second through hole 220b. The first through hole 210b and the second through hole 220b are connected to the storage space 150b, the first thermal block 300b is slidably disposed in the first through hole 210b, and the second thermal block 400b is slidably disposed in the second through hole 220b.

In addition, the second thermal plate 200b further has a first restricting groove 230b and a second restricting groove 240b. The first restricting groove 230b surrounds and is connected to the first through hole 210b, and the second restricting groove 240b surrounds and is connected to the second through hole 220b. The first thermal block 300b further has a first restricting protrusion 320b slidably located in the first restricting groove 230b. The second thermal block 400b further has a second restricting protrusion 420b slidably located in the second restricting groove 240b. That is, two opposite surfaces of the first restricting groove 230b respectively function as movement limitation means for a top dead center and a bottom dead center of the first thermal block 300b. Similarly, two opposite surfaces of the second restricting groove 240b respectively function as movement limitation means for a top dead center and a bottom dead center of the second thermal block 400b.

The liquid cooling device 10b further includes a first sealing component 350b, a second sealing component 450b, a plurality of first elastic components 610b and a plurality of second elastic components 620b.

The first sealing component 350b is located between and clamped by the second thermal plate 200b and the first thermal block 300b, and the second sealing component 450b is located between and clamped by the second thermal plate 200b and the second thermal block 400b, such that the coolant in the storage space 150b is prevented from leaking through a gap between the second thermal plate 200b and the first thermal block 300b or a gap between the second thermal plate 200b and the second thermal block 400b to the exterior.

The first elastic components 610b and the second elastic components 620b are, for example, compression springs, and are located in the storage space 150b. Each of the first elastic components 610b presses against the first thermal plate 100b and the first thermal block 300b at either end, such that when the first thermal block 300b is not in contact with the heat source, the first thermal block 300b is constantly located at the bottom dead center thereof away from the first thermal plate 100b by experiencing an elastic force applied by the first elastic components 610b. Similarly, each of the second elastic components 620b presses against the first thermal plate 100b and the second thermal block 400b at either end, such that when the second thermal block 400b is not in contact with the heat source, the second thermal block 400b is constantly located at the bottom dead center thereof away from the second thermal plate 200b by experiencing an elastic force applied by the second elastic components 620b.

The fasteners 800b are, for example, screws, and are disposed through the first thermal plate 100b and the second thermal plate 200b, and the fasteners 800b are configured to be fixed to assembling studs 26b of a printed circuit board 20b so as to fix the first thermal plate 100b above the printed circuit board 20b, and as such, the first thermal block 300b and the second thermal block 400b are suspended on the second thermal plate 200b. In other embodiments, the fasteners 800b may be directly fixed to a board body of the printed circuit board 20b without the assembling studs 26b connected therebetween, but the present disclosure is not limited thereto.

Figure 9:
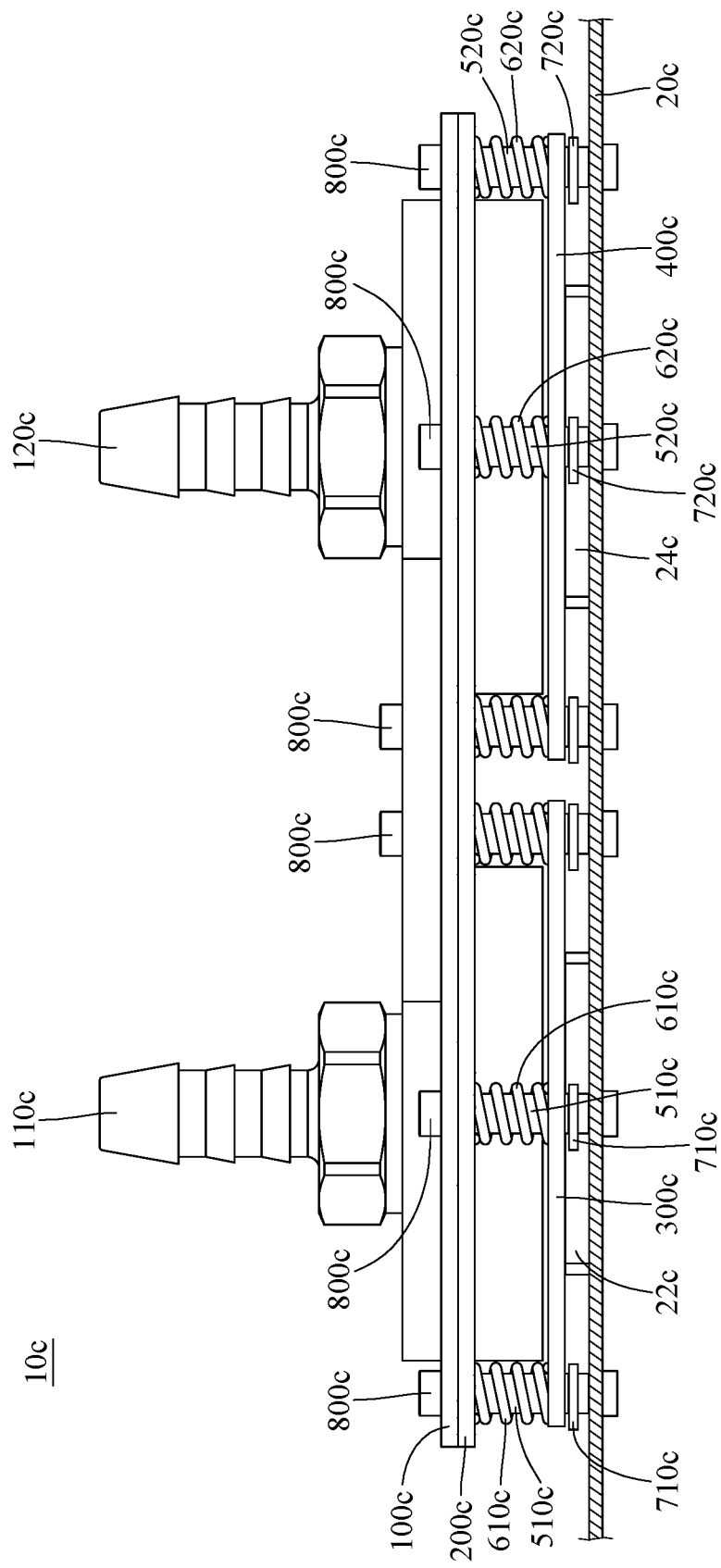
FIG. 9 is a side view of a liquid cooling device disposed on a printed circuit board in accordance with a third embodiment of the present disclosure.
Figure 10:
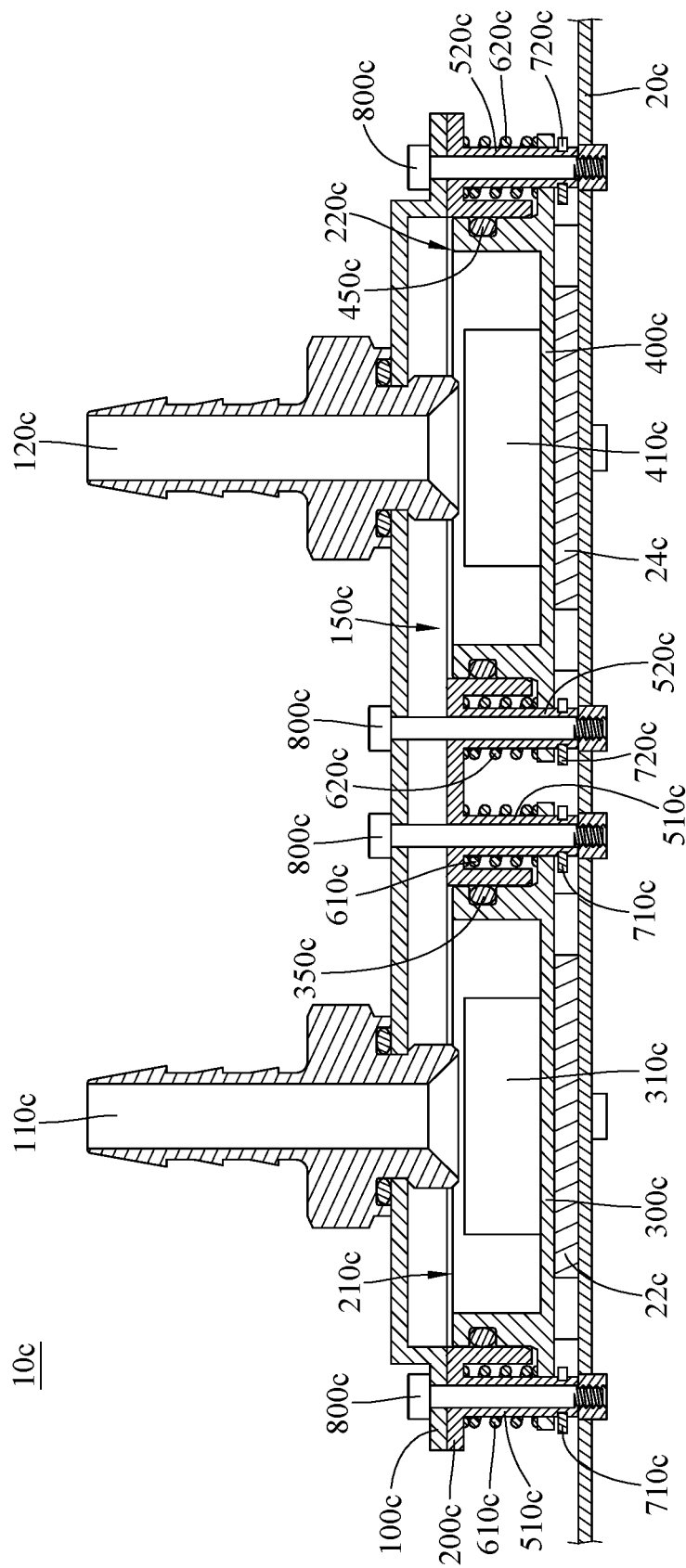
FIG. 10 is a cross-sectional view of FIG. 9.
Figure 11:
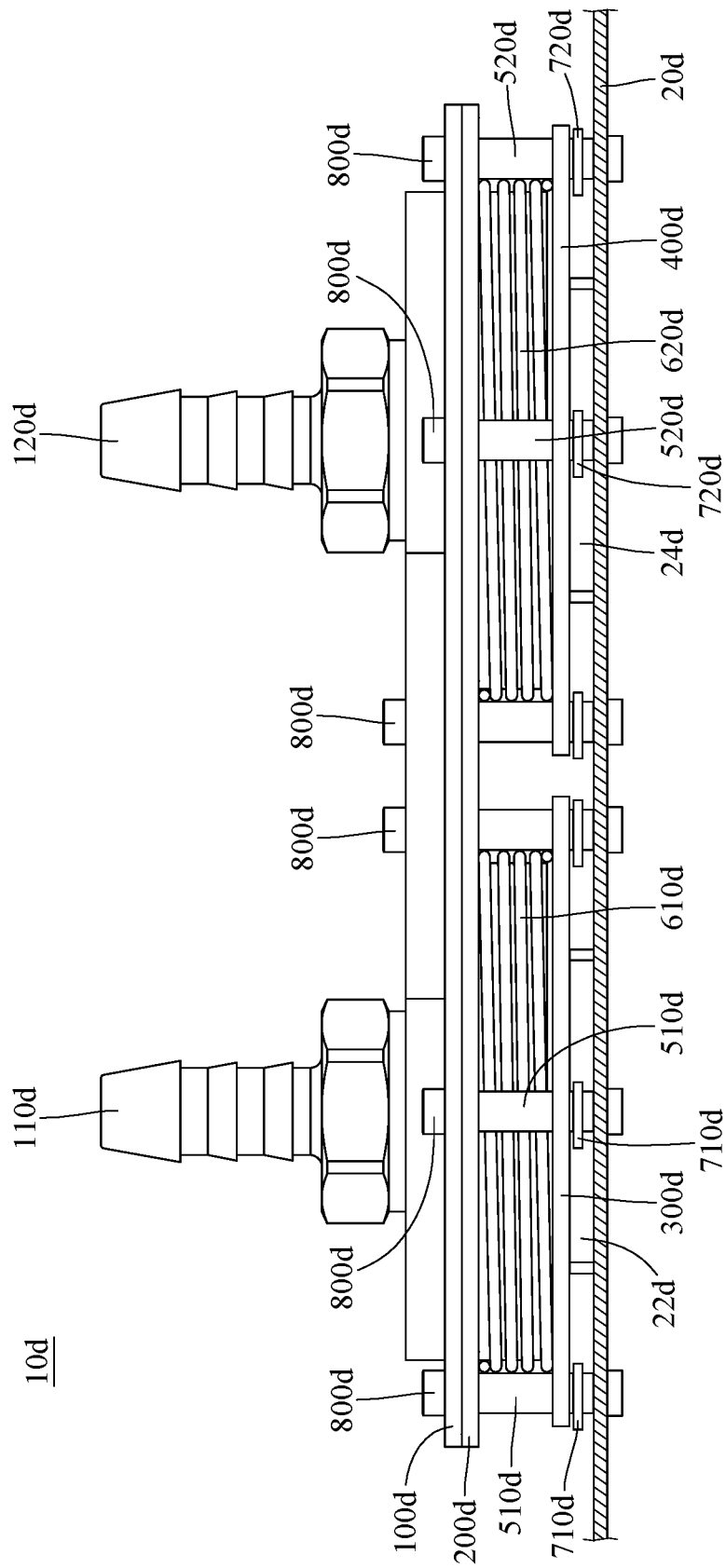
FIG. 11 is a side view of a liquid cooling device disposed on a printed circuit board in accordance with a fourth embodiment of the present disclosure.
Figure 12:
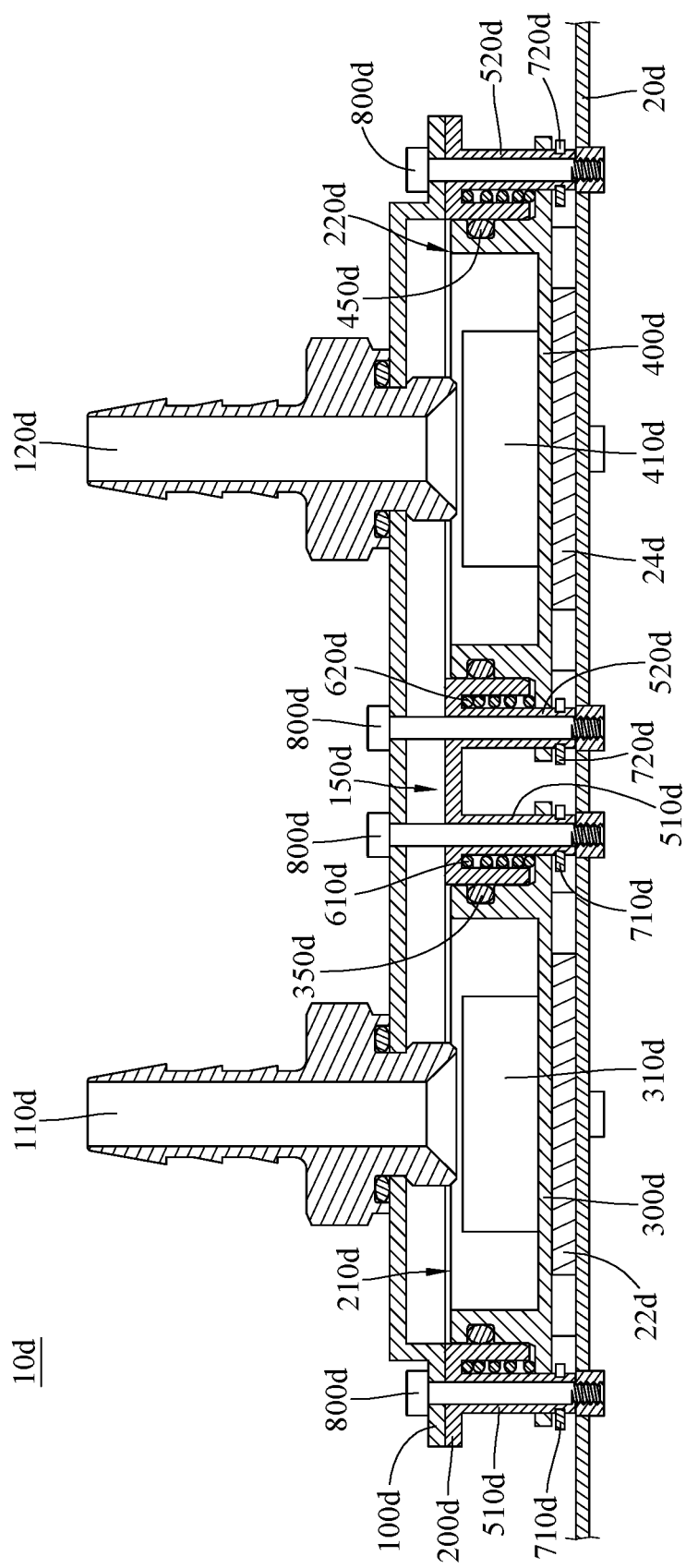
FIG. 12 is a cross-sectional view of FIG. 11.

In the abovementioned embodiment, the assembling studs 26a and the guiding pillars 510a and 520a of the liquid cooling device 10a are independent from one another, but the present disclosure is not limited thereto. Please refer to FIG. 9 to FIG. 12. FIG. 9 is a side view of a liquid cooling device disposed on a printed circuit board in accordance with a third embodiment of the present disclosure, FIG. 10 is a cross-sectional view of FIG. 9, FIG. 11 is a side view of a liquid cooling device disposed on a printed circuit board in accordance with a fourth embodiment of the present disclosure, and FIG. 12 is a cross-sectional view of FIG. 11.

In this embodiment, a liquid cooling device 10c is provided. As shown in FIG. 9 and FIG. 10, in the liquid cooling device 10c, some of fasteners 800c are respectively disposed through a first thermal plate 100c, a second thermal plate 200c and first guiding pillars 510c, and configured to be fixed to a printed circuit board 20c. Furthermore, another some of the fasteners 800c are respectively disposed through the first thermal plate 100c, the second thermal plate 200c and second guiding pillars 520c, and configured to be fixed to the printed circuit board 20c. That is, the fasteners 800c are directly disposed through the guiding pillars and fixed to the printed circuit board 20c, such that the printed circuit board 20c is manufactured without assembling studs. In addition, in this embodiment, first elastic components 610c and second elastic components 620c may be respectively sleeved on the first guiding pillars 510c and the second guiding pillars 520c, which is the same as that shown in FIG. 1; alternatively, as shown in FIG. 11 and FIG. 12, first elastic components 610d and second elastic components 620d are respectively sleeved on first thermal block 300d and second thermal block 400d.

In the abovementioned embodiment, the first thermal block 300a and the second thermal block 400a are movably disposed on the second thermal plate 200a, but the present disclosure is not limited thereto. In other embodiments, one of the thermal blocks may be immovably disposed on the second thermal plate 200a, and the other thermal block may be movably disposed on the second thermal plate 200a. In detail, in the case that the first thermal block 300a is movable and the second thermal block 400a is immovable on the second thermal plate 200a, since the existence of the second guiding pillars 520a is no longer required, some of the fasteners 800a are respectively disposed through the first thermal plate 100a, the second thermal plate 200a and first guiding pillars 510a and configured to be fixed to the printed circuit board 20a, and another some of the fasteners 800a are respectively disposed through the first thermal plate 100a and the second thermal plate 200a and configured to be fixed to the printed circuit board 20a.

Moreover, the quantity of thermal blocks is plural in the abovementioned embodiments, but the present disclosure is not limited thereto. In other embodiments, there may be only one thermal block in a liquid cooling device, and an elastic component may be designed to surround the thermal block or surround a guiding pillar, and fasteners may be designed to be disposed through the guiding pillar.

According to the liquid cooling device as described above, in some embodiments, there are a plurality of thermal blocks disposed on the second thermal plate to be in thermal contact with the heat sources, and at least one of the thermal blocks is movably disposed on the second thermal plate, such that the protruding height of the movable thermal block from the second thermal plate is adjustable according to the gap width between the heat source and the second thermal plate. As such, regardless of the mechanical interference between the heat source and the thermal block or the gap between the heat source and the thermal block, the thermal blocks are ensured to be in thermal contact with the heat sources.

Furthermore, when the thermal blocks are designed to be independently movable with respect to one another, the strength of each spring may be designed differently from one another according to the differences of the heat sources, helping to control the contact strength and heat dissipation effect to meet respective thermal contact requirements of the heat sources.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A liquid cooling device, configured to be in thermal contact with a first heat source and a second heat source which are disposed on a printed circuit board, the liquid cooling device comprising:
    a first thermal plate, configured to be disposed on the printed circuit board;
    a second thermal plate, disposed on the first thermal plate, the first thermal plate and the second thermal plate together forming a storage space, and the storage space configured to store a coolant; and
    a first thermal block and a second thermal block, wherein the first thermal block is configured to be in thermal contact with the first heat source, the second thermal block is configured to be in thermal contact with the second heat source; the first thermal block and the second thermal block are movably disposed on the second thermal plate, such that a protruding height of the first thermal block from the second thermal plate is adjustable according to a gap width between the first heat source and the second thermal plate, and a protruding height of the second thermal block from the second thermal plate is adjustable according to a gap width between the second heat source and the second thermal plate.

2. The liquid cooling device according to claim 1, further comprising at least one first elastic component and at least one second elastic component, wherein one end of the at least one first elastic component is connected to the first thermal plate or the second thermal plate, and another end of the at least one first elastic component is connected to the first thermal block so that the at least one first elastic component forces the first thermal block to move away from the first thermal plate; one end of the at least one second elastic component is connected to the first thermal plate or the second thermal plate, and another end of the at least one second elastic component is connected to the second thermal block so that the at least one second elastic component forces the second thermal block to move away from the first thermal plate.

3. The liquid cooling device according to claim 2, wherein the at least one first elastic component and the at least one second elastic component are located in the storage space, two opposite ends of the first elastic component respectively press against the first thermal plate and the first thermal block, and two opposite ends of the second elastic component respectively press against the first thermal plate and the second thermal block.

4. The liquid cooling device according to claim 2, wherein the at least one first elastic component surrounds the first thermal block, the at least one second elastic component surrounds the second thermal block, two opposite ends of the first elastic component respectively press against the second thermal plate and the first thermal block, and two opposite ends of the second elastic component respectively press against the second thermal plate and the second thermal block.

5. The liquid cooling device according to claim 1, further comprising a plurality of first guiding pillars and a plurality of second guiding pillars, wherein one end of each of the plurality of first guiding pillars is fixed on the second thermal plate, another end of each of the plurality of first guiding pillars is integrated into the first thermal block, one end of each of the plurality of second guiding pillars is fixed on the second thermal plate, and another end of each of the plurality of second guiding pillars is disposed through the second thermal block.

6. The liquid cooling device according to claim 5, further comprising a plurality of first retaining rings and a plurality of second retaining rings, wherein the plurality of first retaining rings are respectively attached to the plurality of first guiding pillars and located on one side of the first thermal block away from the first thermal plate, and the plurality of second retaining rings are respectively attached to the plurality of second guiding pillars and located on one side of the second thermal block away from the first thermal plate.

7. The liquid cooling device according to claim 6, further comprising a plurality of first elastic components and a plurality of second elastic components, wherein the plurality of first elastic components are respectively sleeved on the plurality of first guiding pillars, one end of each of the plurality of first elastic components presses against the second thermal plate, and another end of each of the plurality of first elastic components presses against the first thermal block so that the plurality of first elastic components force the first thermal block to move away from the first thermal plate; the plurality of second elastic components are respectively sleeved on the plurality of second guiding pillars, one end of each of the plurality of second elastic components presses against the second thermal plate, and another end of each of the plurality of second elastic components presses against the second thermal block so that the plurality of second elastic components force the second thermal block to move away from the first thermal plate.

8. The liquid cooling device according to claim 5, further comprising a plurality of fasteners, wherein some of the plurality of fasteners are respectively disposed through the first thermal plate, the second thermal plate and the plurality of first guiding pillars and configured to be fixed to the printed circuit board, and another some of the plurality of fasteners are respectively disposed through the first thermal plate, the second thermal plate and the plurality of second guiding pillars and configured to be fixed to the printed circuit board.

9. The liquid cooling device according to claim 1, wherein the second thermal plate further has a first through hole and a second through hole, the first through hole and the second through hole are connected to the storage space, the first thermal block is slidably disposed in the first through hole, and the second thermal block is slidably disposed in the second through hole.

10. The liquid cooling device according to claim 9, wherein the second thermal plate further has a first restricting groove and a second restricting groove, the first restricting groove is connected to the first through hole, the second restricting groove is connected to the second through hole, the first thermal block further has a first restricting protrusion, the first restricting protrusion is slidably located in the first restricting groove, the second thermal block further has a second restricting protrusion, and the second restricting protrusion is slidably located in the second restricting groove.

11. The liquid cooling device according to claim 9, further comprising a first sealing component and a second sealing component, wherein the first sealing component is located between and clamped by the second thermal plate and the first thermal block, and the second sealing component is located between and clamped by the second thermal plate and the second thermal block.

12. The liquid cooling device according to claim 1, wherein the first thermal block further has a first cooling fin, the first cooling fin is located in the storage space, the second thermal block further has a second cooling fin, and the second cooling fin is located in the storage space.

13. The liquid cooling device according to claim 1, further comprising a plurality of fasteners, wherein the plurality of fasteners are disposed through the first thermal plate and the second thermal plate and configured to be fixed to the printed circuit board.

14. The liquid cooling device according to claim 1, wherein the first thermal plate further has a liquid inlet and a liquid outlet, and the liquid inlet and the liquid outlet are connected to the storage space.

15. A liquid cooling device, configured to be in thermal contact with a first heat source and a second heat source which are disposed on a printed circuit board, the liquid cooling device comprising:
 a first thermal plate, configured to be disposed on the printed circuit board;
 a second thermal plate, disposed on the first thermal plate, the first thermal plate and the second thermal plate together forming a storage space, and the storage space configured to store a coolant; and
 a first thermal block and a second thermal block, wherein the first thermal block is configured to be in thermal contact with the first heat source, the second thermal block is configured to be in thermal contact with the second heat source, the second thermal block is immovably fixed on the second thermal plate; the first thermal block is movably disposed on the second thermal plate, such that a protruding height of the first thermal block from the second thermal plate is adjustable according to a gap width between the first heat source and the second thermal plate.

16. The liquid cooling device according to claim 15, further comprising at least one first elastic component, wherein one end of the at least one first elastic component is connected to the first thermal plate or the second thermal plate, and another end of the at least one first elastic component is connected to the first thermal block so that the at least one first elastic component forces the first thermal block to move away from the first thermal plate.

17. The liquid cooling device according to claim 15, further comprising a plurality of first guiding pillars, wherein one end of each of the plurality of first guiding pillars is fixed on the second thermal plate, and another end of each of the plurality of first guiding pillars is integrated into the first thermal block.

18. The liquid cooling device according to claim 17, further comprising a plurality of first retaining rings, wherein the plurality of first retaining rings are respectively attached to the plurality of first guiding pillars and located on one side of the first thermal block away from the first thermal plate.

19. The liquid cooling device according to claim 18, further comprising a plurality of first elastic components, wherein the plurality of first elastic components are respectively sleeved on the plurality of first guiding pillars, one end of each of the plurality of first elastic components presses against the first thermal plate, and another end of each of the plurality of first elastic components presses against the first thermal block so that the plurality of first elastic components force the first thermal block to move away from the first thermal plate.

20. The liquid cooling device according to claim 17, further comprising a plurality of fasteners, wherein some of the plurality of fasteners are respectively disposed through the first thermal plate, the second thermal plate and the plurality of first guiding pillars and configured to be fixed to the printed circuit board, and another some of the plurality of fasteners are respectively disposed through the first thermal plate and the second thermal plate and configured to be fixed to the printed circuit board.

21. The liquid cooling device according to claim 15, further comprising at least one first elastic component, wherein the at least one first elastic component is located in the storage space, and two opposite ends of the at least one first elastic component respectively press against the first thermal plate and the first thermal block.

22. The liquid cooling device according to claim 15, further comprising at least one first elastic component, wherein the at least one first elastic component surrounds the first thermal block, and two opposite ends of the at least one first elastic component respectively press against the second thermal plate and the first thermal block.

23. The liquid cooling device according to claim 15, wherein the second thermal plate further has a first through hole, the first through hole is connected to the storage space, and the first thermal block is slidably disposed in the first through hole.

24. The liquid cooling device according to claim 23, wherein the second thermal plate further has a first restricting groove, the first restricting groove is connected to the first through hole, the first thermal block further has a first restricting protrusion, and the first restricting protrusion is slidably located in the first restricting groove.

25. The liquid cooling device according to claim 23, further comprising a first sealing component, wherein the first sealing component is located between and clamped by the second thermal plate and the first thermal block.

26. The liquid cooling device according to claim 15, wherein the first thermal block further has a first cooling fin, the first cooling fin is located in the storage space, the second thermal block further has a second cooling fin, and the second cooling fin is located in the storage space.

27. The liquid cooling device according to claim 15, further comprising a plurality of fasteners, wherein the plurality of fasteners are disposed through the first thermal plate and the second thermal plate and configured to be fixed to the printed circuit board.

28. A liquid cooling device, configured to be in thermal contact with a first heat source which is disposed on a printed circuit board, the liquid cooling device comprising:
a first thermal plate, configured to be disposed on the printed circuit board;
a second thermal plate, disposed on the first thermal plate, the first thermal plate and the second thermal plate together forming a storage space, and the storage space configured to store a coolant;
a first thermal block, configured to be in thermal contact with the first heat source, and the first thermal block movably disposed on the second thermal plate; and
a first elastic component, surrounding the first thermal block, wherein one end of the first elastic component is connected to the second thermal plate, and another end of the first elastic component is connected to the first thermal block so that the first elastic component forces the first thermal block to move away from the first thermal plate, and a protruding height of the first thermal block from the second thermal plate is adjustable according to a gap width between the first heat source and the second thermal plate.

29. The liquid cooling device according to claim 28, further comprising a plurality of first guiding pillars, wherein one end of each of the plurality of first guiding pillars is fixed on the second thermal plate, and another end of each of the plurality of first guiding pillars is integrated into the first thermal block.

30. The liquid cooling device according to claim 29, further comprising a plurality of first retaining rings, wherein the plurality of first retaining rings are respectively attached to the plurality of first guiding pillars and located on one side of the first thermal block away from the first thermal plate.

31. The liquid cooling device according to claim 29, further comprising a plurality of fasteners, wherein the plurality of fasteners are respectively disposed through the first thermal plate, the second thermal plate and the plurality of first guiding pillars and configured to be fixed to the printed circuit board.

32. The liquid cooling device according to claim 28, wherein the second thermal plate further has a first through hole, the first through hole is connected to the storage space, and the first thermal block is slidably disposed in the first through hole.

33. The liquid cooling device according to claim 32, further comprising a first sealing component, wherein the first sealing component is located between and clamped by the second thermal plate and the first thermal block.

34. The liquid cooling device according to claim 28, wherein the first thermal block further has a first cooling fin, and the first cooling fin is located in the storage space.

35. The liquid cooling device according to claim 28, further comprising a plurality of fasteners, wherein the plurality of fasteners are disposed through the first thermal plate and the second thermal plate and configured to be fixed to the printed circuit board.

36. A liquid cooling device, configured to be in thermal contact with a first heat source which is disposed on a printed circuit board, the liquid cooling device comprising:
a first thermal plate, configured to be disposed on the printed circuit board;

a second thermal plate, disposed on the first thermal plate, the first thermal plate and the second thermal plate together forming a storage space, and the storage space configured to store a coolant;

a first thermal block, configured to be in thermal contact with the first heat source, and the first thermal block movably disposed on the second thermal plate;

a plurality of first guiding pillars, wherein one end of each of the plurality of first guiding pillars is fixed on the second thermal plate, another end of each of the plurality of first guiding pillars is integrated into the first thermal block; and a plurality of first elastic components, respectively surrounding the plurality of first guiding pillars, wherein one end of each of the plurality of first elastic components is connected to the second thermal plate, and another end of each of the plurality of first elastic components is connected to the first thermal block so that the plurality of first elastic components force the first thermal block to move away from the first thermal plate, and a protruding height of the first thermal block from the second thermal plate is adjustable according to a gap width between the first heat source and the second thermal plate.

37. The liquid cooling device according to claim 36, further comprising a plurality of first retaining rings, wherein the plurality of first retaining rings are respectively attached to the plurality of first guiding pillars and located on one side of the first thermal block away from the first thermal plate.

38. The liquid cooling device according to claim 36, further comprising a plurality of fasteners, wherein the plurality of fasteners respectively disposed through the first thermal plate, the second thermal plate and the plurality of first guiding pillars and configured to be fixed to the printed circuit board.

39. The liquid cooling device according to claim 36, wherein the second thermal plate further has a first through hole, the first through hole is connected to the storage space, and the first thermal block is slidably disposed in the first through hole.

40. The liquid cooling device according to claim 39, further comprising a first sealing component, wherein the first sealing component is located between and clamped by the second thermal plate and the first thermal block.

41. The liquid cooling device according to claim 36, wherein the first thermal block further has a first cooling fin, and the first cooling fin is located in the storage space.

42. The liquid cooling device according to claim 36, further comprising a plurality of fasteners, wherein the plurality of fasteners are disposed through the first thermal plate and the second thermal plate and configured to be fixed to the printed circuit board.

43. A liquid cooling device, configured to be in thermal contact with a first heat source which is disposed on a printed circuit board, the liquid cooling device comprising:

a first thermal plate, configured to be disposed on the printed circuit board;

a second thermal plate, disposed on the first thermal plate, the first thermal plate and the second thermal plate together forming a storage space, and the storage space configured to store a coolant;

a first thermal block, configured to be in thermal contact with the first heat source, and the first thermal block movably disposed on the second thermal plate;

a plurality of first guiding pillars, wherein one end of each of the plurality of first guiding pillars is fixed on the second thermal plate, another end of each of the plurality of first guiding pillars is integrated into the first thermal block so as to guide the first thermal block to move relative to the second thermal plate; and a plurality of fasteners, respectively disposed through the first thermal plate, the second thermal plate and the plurality of first guiding pillars and configured to be fixed to the printed circuit board.

44. The liquid cooling device according to claim 43, further comprising at least one first elastic component, wherein one end of the at least one first elastic component is connected to the first thermal plate or the second thermal plate, and another end of the at least one first elastic component is connected to the first thermal block so that the at least one first elastic component forces the first thermal block to move away from the first thermal plate.

45. The liquid cooling device according to claim 43, further comprising a plurality of first retaining rings, wherein the plurality of first retaining rings are respectively attached to the plurality of first guiding pillars and located on one side of the first thermal block away from the first thermal plate.

46. The liquid cooling device according to claim 43, wherein the second thermal plate further has a first through hole, the first through hole is connected to the storage space, and the first thermal block is slidably disposed in the first through hole.

47. The liquid cooling device according to claim 43, further comprising a first sealing component, wherein the first sealing component is located between and clamped by the second thermal plate and the first thermal block.

* * * * *